United States Patent
Stephens et al.

(10) Patent No.: US 6,345,404 B1
(45) Date of Patent: Feb. 12, 2002

(54) WAFER CLEANING APPARATUS

(75) Inventors: Donald Edgar Stephens, Westlake Village; Oliver David Jones, Watsonville; Hugo John Miller, III, San Jose, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/440,223

(22) Filed: Nov. 15, 1999

Related U.S. Application Data

(60) Continuation of application No. 09/126,021, filed on Jul. 29, 1998, now Pat. No. 6,143,089, which is a division of application No. 08/683,654, filed on Jul. 15, 1996, now Pat. No. 5,875,507.

(51) Int. Cl.$^7$ ................................. B08B 1/04
(52) U.S. Cl. .......................... 15/102; 15/88.3
(58) Field of Search .............. 15/77, 88.2, 88.3, 15/97.1, 102, 308, DIG. 14

(56) References Cited

U.S. PATENT DOCUMENTS

| | | | |
|---|---|---|---|
| 4,062,463 A | | 12/1977 | Hillman et al. |
| 4,202,071 A | | 5/1980 | Scharpf |
| 4,208,760 A | | 6/1980 | Dexter et al. |
| 4,382,308 A | | 5/1983 | Curcio |
| 4,569,695 A | | 2/1986 | Yamashita et al. |
| 5,317,778 A | * | 6/1994 | Kudo et al. ............. 15/88.3 |
| 5,351,360 A | | 10/1994 | Suzuki et al. |
| 5,357,645 A | | 10/1994 | Onodera |
| 5,361,449 A | | 11/1994 | Akimoto |
| 5,442,828 A | | 8/1995 | Lutz |
| 5,475,889 A | | 12/1995 | Thrasher et al. |
| 5,529,638 A | | 6/1996 | Lutz |
| 5,555,177 A | | 9/1996 | Simmons |
| 5,581,837 A | | 12/1996 | Uchiyama et al. |
| 5,606,251 A | | 2/1997 | Ryle et al. |
| 5,624,501 A | | 4/1997 | Gill, Jr. |
| 5,639,311 A | * | 6/1997 | Holley et al. ............. 15/77 |
| 5,651,160 A | | 7/1997 | Yonemizu et al. |
| 5,675,856 A | | 10/1997 | Itzkowitz |
| 5,693,148 A | | 12/1997 | Simmons et al. |
| 5,723,019 A | | 3/1998 | Krussell et al. |
| 5,727,332 A | | 3/1998 | Thrasher et al. |
| 5,745,946 A | | 5/1998 | Thrasher et al. |
| 5,778,554 A | | 7/1998 | Jones |
| 5,806,126 A | | 9/1998 | deLarios et al. |
| 5,875,507 A | * | 3/1999 | Stephens et al. ............. 15/102 |
| 5,933,902 A | | 8/1999 | Frey |
| 6,079,073 A | * | 6/2000 | Meakawa ............. 15/102 |
| RE36,767 E | * | 7/2000 | Itzkowitz ............. 15/102 |

FOREIGN PATENT DOCUMENTS

| | | | |
|---|---|---|---|
| EP | 0 526 245 A1 | | 2/1993 |
| JP | 59-86226 | | 5/1984 |
| JP | 6-163491 | | 6/1994 |
| JP | 06163491 | * | 6/1994 |
| WO | WO 97/13590 | | 4/1997 |

* cited by examiner

*Primary Examiner*—Terrence R. Till
(74) *Attorney, Agent, or Firm*—Martine & Penilla, LLP

(57) ABSTRACT

An apparatus for cleaning a wafer oriented vertically is provided. The apparatus includes a first brush and a second brush located horizontally from the first brush. During use, a wafer is oriented vertically the first and second brushes. The brushes are brought into contact with the wafer and rotated thereby engaging the wafer with rollers. By rotating the rollers, the wafer is also rotated. Liquid is sprayed towards the brushes and wafer. By orienting the wafer vertically, liquid and particulates contained therein readily fall from the water due to gravity. This is particularly advantageous when cleaning larger diameter wafers in which particulates must be removed from a larger wafer surface area.

3 Claims, 6 Drawing Sheets

WAFER CLEANING APPARATUS

This application is a continuation of U.S. application Ser. No. 09/126,021, filed on Jul. 29, 1998, now U.S. Pat. No. 6,143,089, which is a divisional of U.S. application Ser. No. 08/683,654, filed on Jul. 15, 1996, now U.S. Pat. No. 5,875,507, the disclosures of which are incorporated herein by reference.

FIELD OF THE INVENTION

The present invention relates generally to semiconductor processing and more particularly to a an apparatus for cleaning waters.

BACKGROUND OF THE INVENTION

Semiconductor manufacturing processes demand wafers, typically silicon wafers, which are substantially particulate free. As the semiconductor industry moves towards processing larger diameter wafers, for example 12-inch diameter wafers, it becomes increasingly difficult to remove particulates from the wafers. In particular, water cleaning processes must effectively remove particulates from the larger water surface area associated with the larger diameter wafers. Further, wafer cleaning processes must clean the wafers without exerting undue force on the wafers since larger diameter wafers have less mechanical strength than smaller diameter wafers.

SUMMARY OF THE INVENTION

In accordance with the present invention, an apparatus for cleaning a wafer oriented vertically is provided. In one embodiment, the apparatus includes a first brush and a second brush located horizontally from the first brush The first brush and the second brush define a region between the brushes. Located vertically below the region defined by the first and second brushes, is a pair of rollers. During use, a wafer in located vertically in the region between the first and second brushes and rests on the pair of rollers.

The apparatus further includes first and second brush positioners which move the first and second brushes, respectively, from first positions to second positions. In this manner, a wafer can be loaded and the first ad second brushes can be moved to contact surfaces of the wafer.

The first and second brushes are mounted on first ends of first and second shafts. Motors are connected to pulleys on the second ends of the first and second shafts. During use, the motors rotate the first and second shafts in opposite directions thereby rotating the first and second brushes in opposite directions. This forces the wafer into V-grooves in the pair of rollers. The wafer is then rotated by rotating the pair of rollers.

Preferably, the first and second shafts have central cavities formed therein and also have perforations in the regions where the first and second brushes are mounted. In this manner, liquid can be delivered to the first and second brushes though the first and second shafts to flush the first and second brushes from the inside out.

The wafer cleaning apparatus can further include first and send sets of spray nozzles capable of spraying a first liquid towards the wafer between the first and second brushes. The wafer cleaning apparatus can further include third and fourth sets of spray nozzles capable of spraying a second liquid towards the wafer between he first and second brushes. In one embodiment, the first liquid and the second liquid are the same liquid, and the liquid is a surfactant.

Alternatively, the first and second sets of spray nozzles can comprise first nozzles capable of spraying the first liquid and second nozzles capable of spraying the second liquid.

The combination of the scrubbing action on the wafer surfaces by the first and second brushes along with the liquid sprayed on the wafer surfaces from the first and second sets of spray nozzles remove particulates from the wafer surfaces. Since the wafer is oriented vertically, removal of particulates is enhanced since the liquid sprayed on to the wafer surfaces and the particulates trapped therein have a tendency to fall from the wafer surfaces due to gravity. This is particularly advantageous when cleaning larger diameter wafers, such as 8-inch or 12-inch diameter wafers, in which particulates must be removed from a larger surface area.

Further, by orienting the wafer vertically and by scrubbing both wafer surfaces simultaneously, mechanical stress on the wafer is minimized. This is particularly advantageous for larger diameter wafers which have less mechanical strength than smaller diameter wafers.

These and other objects, features and advantages of the present invention will be more readily apparent from the detailed description of the preferred embodiments set forth below taken in conjunction with the accompanying drawings.

DESCRIPTION OR THE PREFERRED EMBODIMENT

In accordance with the present invention, an apparatus for cleaning a wafer oriented vertically is provided. Several elements shown in the following figures are substantially similar. Therefore, similar reference numbers are used to represent similar elements.

Figure 1:
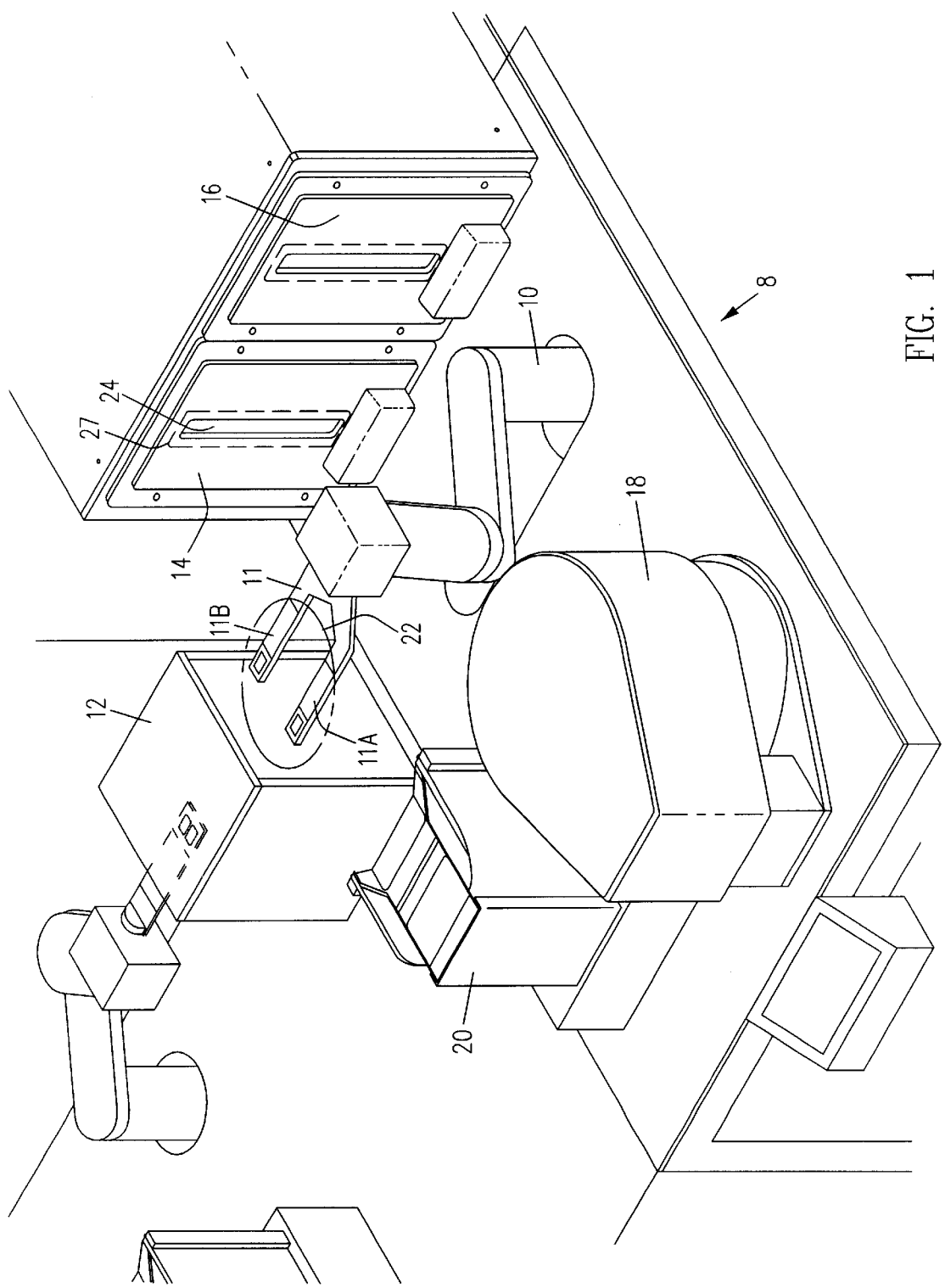
FIG. 1 is a perspective view of wafer cleaning system including a pair of wafer cleaners in accordance with the present invention

FIG. 1 is a perspective view of wafer cleaning system 8 including wafer cleaners 14, 16 in accordance with the present invention. Wafer cleaning system a includes a robotic arm 10, a wet buffer unit 12, wafer cleaners 14, 16, a spin drying unit 18, and a finish cassette 20.

Robotic arm 10 has an end-effector 11 which uses a vacuum to hold a wafer. End-effector 11 can be rotated from the horizontal position in which arm 11A is located horizontally from arm 11B, as shown in FIG. 1, to a vertical position in which arm 11A is located above arm 11B. Wet buffer unit 12 includes a plurality of horizontal slots in which to hold wafers. Typically, wet buffer unit 12 has sprayers which spray liquid on the wafers to keep the wafers wet from previous wafer processing, such as wafer polishing. Wafer cleaners 14 and 16, which are described in detail below, are substantially identical with the exception, in this embodiment, that a different scrubbing solution is used in water cleaner 14 than in wafer cleaner 16. Spin drying unit 18 drys the wafer by spinning the wafer at high speeds, thereby removing any liquid from the surface of the wafer. Spin drying unit 18 is further described in U.S. application Ser. No. 08/680,739, now U.S. Pat. No. 5,778,554, herein incorporated by reference in its entirety. Finish cassette 20 has a plurality of slots for holding the finished wafers.

During use, robotic arm 10 removes a wafer which is oriented horizontally from wet buffer unit 12 (the perimeter 22 of the wafer as it is removed from wet buffer unit 12 is indicated In FIG. 1). Robotic arm 10 then rotates the wafer 90° to a vertical orientation and inserts the wafer into vertical slot 24 of wafer cleaner 14. After processing of the wafer in wafer cleaner 14 (described below), robotic arm 10 removes the wafer from wafer cleaner 14 through slot 24. This sequence is repeated with wafer cleaner 16. The wafer is then rotated 90° by robotic arm 10. The wafer is then loaded horizontally into spin dryer 18 and finally is loaded from spin dryer 18 to finish cassette 20.

Figure 2:
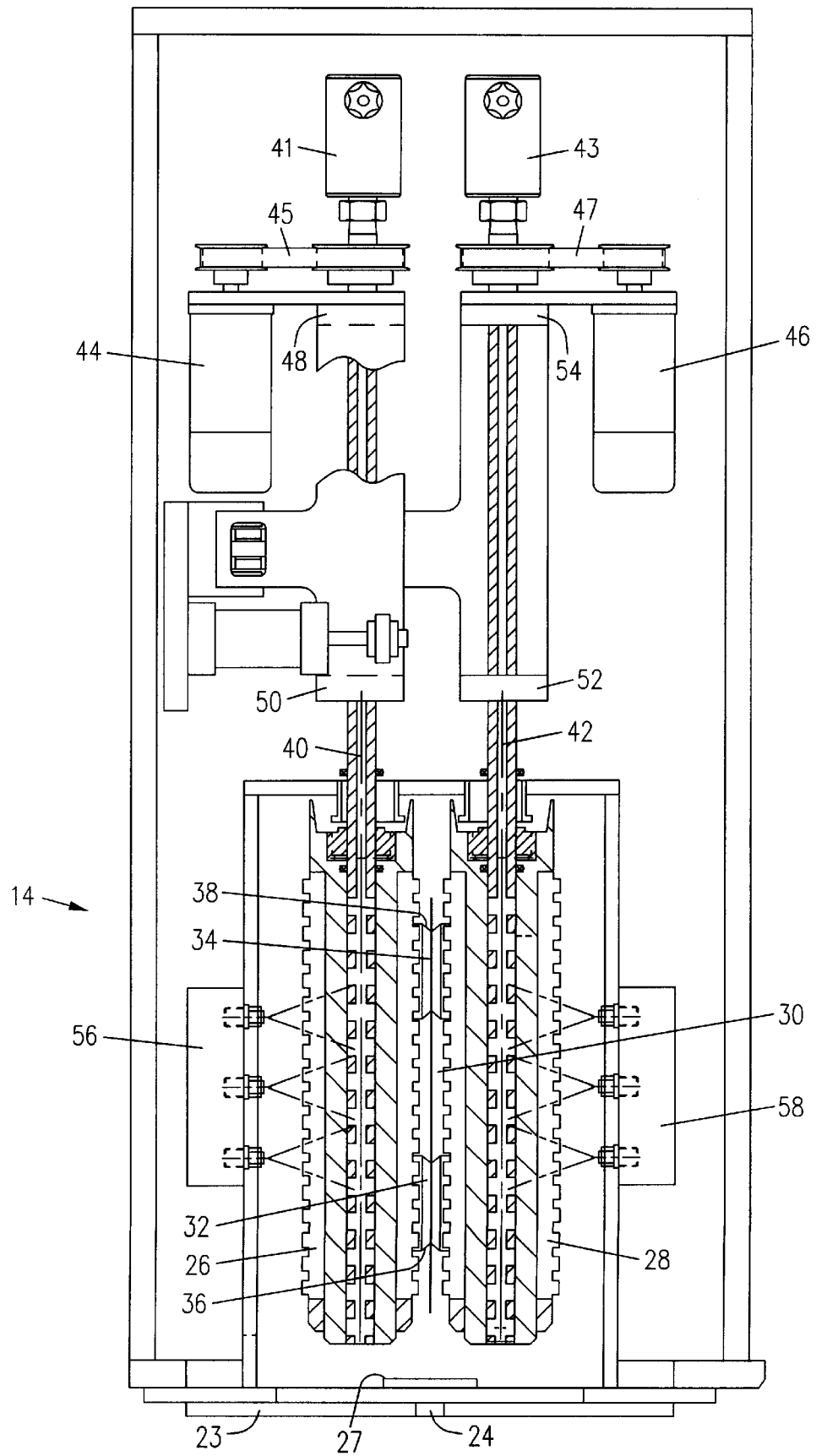
FIG. 2 is a partial top view of one of the wafer cleaners.

FIG. 2 is a partial top view of wafer cleaner 14 in accordance with the present invention. As shown, wafer cleaner 14 includes a housing 23 which includes slot 24 through which a wafer is inserted into wafer cleaner 14. Slot 24 is fitted with a door 27 which opens and closes slot 24. Wafer cleaner 14 further includes a first rotary brush 26 and a second rotary brush 28. Brushes 26, 28 are made of polyvinyl alcohol (PVA) foam although other materials such as nylon, mohair or a mandrel wrapped with polishing pad material can be used. In one embodiment, brushes 26, 28 are PVA foam manufactured by KANEBO of Japan. Brushes 26, 28 are located horizontally from one another.

Located between brushes 26, 28, and defined by brushes 26, 28, is a region 30. Located vertically below region 30 is a first roller 32 and a second roller 34. Rollers 32, 34 have V-grooves 36, 38, respectively, extending around the periphery of the rollers.

Brushes 26, 28 are mounted to first ends of shafts 40, 42, respectively. Rotary unions 41, 43 are mounted to second ends of shafts 40, 42, respectively. Shafts 40, 42 have central cavities formed therein which allow liquid to flow from rotary unions 41, 43 through shafts 40, 42, respectively. Further, shafts 40, 42 have perforations in the regions of shafts 40, 42 to which brushes 26, 28, respectively, are mounted. The perforations allow liquid to be distributed from shafts 40, 42 to brushes 26, 28.

Wafer cleaner 14 further includes a plurality of spray nozzles. In particular, located proximate to and above brush 26 is a first set of spray nozzles 56. Similarly, located proximate to and above brush 28 is a second set of spray nozzles 58. During use, first and second sets of spray nozzles 56, 58, spray liquid towards a wafer located between brushes 26, 28, respectively. In one embodiment, first and second sets of spray nozzles 56, 58, each comprise three individual spray nozzles.

Servo motors 44, 46 are connected to pulleys on the second ends of shafts 40, 42 by drive belts 45, 47, respectively. Shaft 40 is mounted into bearings 48 and 50. Similarly, shaft 42 is mounted into bearings 52 and 54.

Figure 3:
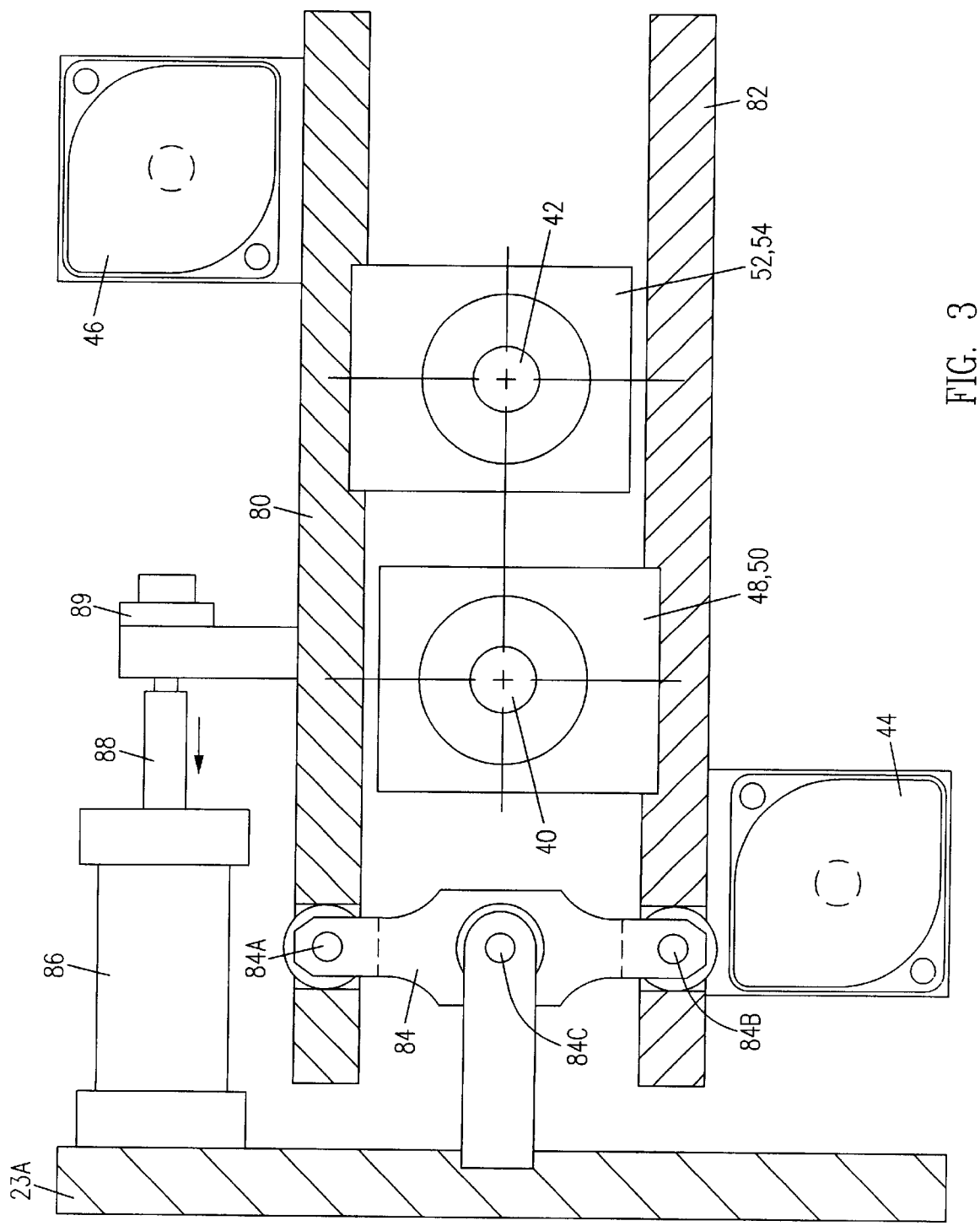
FIG. 3 is a partial frontal view of the water cleaner.

FIG. 3 is a partial front view of wafer cleaner 14 in accordance with the present invention. As shown in FIG. 3, bearings 52, 54 are mounted to an upper movable plate 80. Bearings 48, 50 are mounted to a lower movable plate 82. Motors 46, 44 are also mounted to movable plates 80, 82, respectfully. During use, motors 44, 46 rotate shafts 40, 42 in opposite directions, thereby rotating brushes 26, 28 in opposite directions, respectively. Generally, brushes 26, 28 are rotated between 50 to 1500 revolutions per minute.

Further, upper place 80 is coupled to a first end 84A of a pivot 94 and lower place 82 is coupled to a second end 84B of pivot 84. Pivot 84 is coupled at its center 84C to a section 23A of housing 23 (or alternatively to a plate 23A connected to housing 23). Also coupled to section 23A is an air cylinder 86. Air cylinder 86 has a piston 88 coupled by a pressure transducer 89 to upper plate 80.

By controlling pressurized air flow into and out of air cylinder 86, the position of piston 88 can be controlled, and hence the position of brushes 26, 28 can be controlled, in particular, when Piston 88 is partially extended as in FIG. 3, brushes 26, 28 are located at a distance from one another. However, when piston 88 is retracted into air cylinder 86 (moved in the direction towards section 23A as indicated by the arrow in FIG. 3), upper plate 80 is also moved cowards section 23A. Since shaft 42 is mounted to upper plate 80, shaft 42 and brush 28 are also moved towards section 23A.

The movement of upper plate 80 towards section 23A causes first end 84A of pivot 84 to also move towards section 23A. Since pivot 84 is coupled at its center 84C co section 23A, the motion of first end 84A causes an equal and opposite motion of second end 84D of pivot 84. Thus, as upper plate 80 moves towards section 23A, lower plate 82 moves away from section 23A. Since shaft 40 is mounted to lower plate 82, shaft 40 and brush 26 are also moved away from section 23A. The net result is that when piston 88 is retracted, brushes 26, 28 are moved towards one another and when piston 88 is extended (moved away from section 23A), brushes 26, 28 are moved away from one another. Further, the pivot 84 ensures that the perpendicular component of force (further described below) of each brush (26, 28) is equal and opposite to that of the other brush (28, 26).

Figure 4:
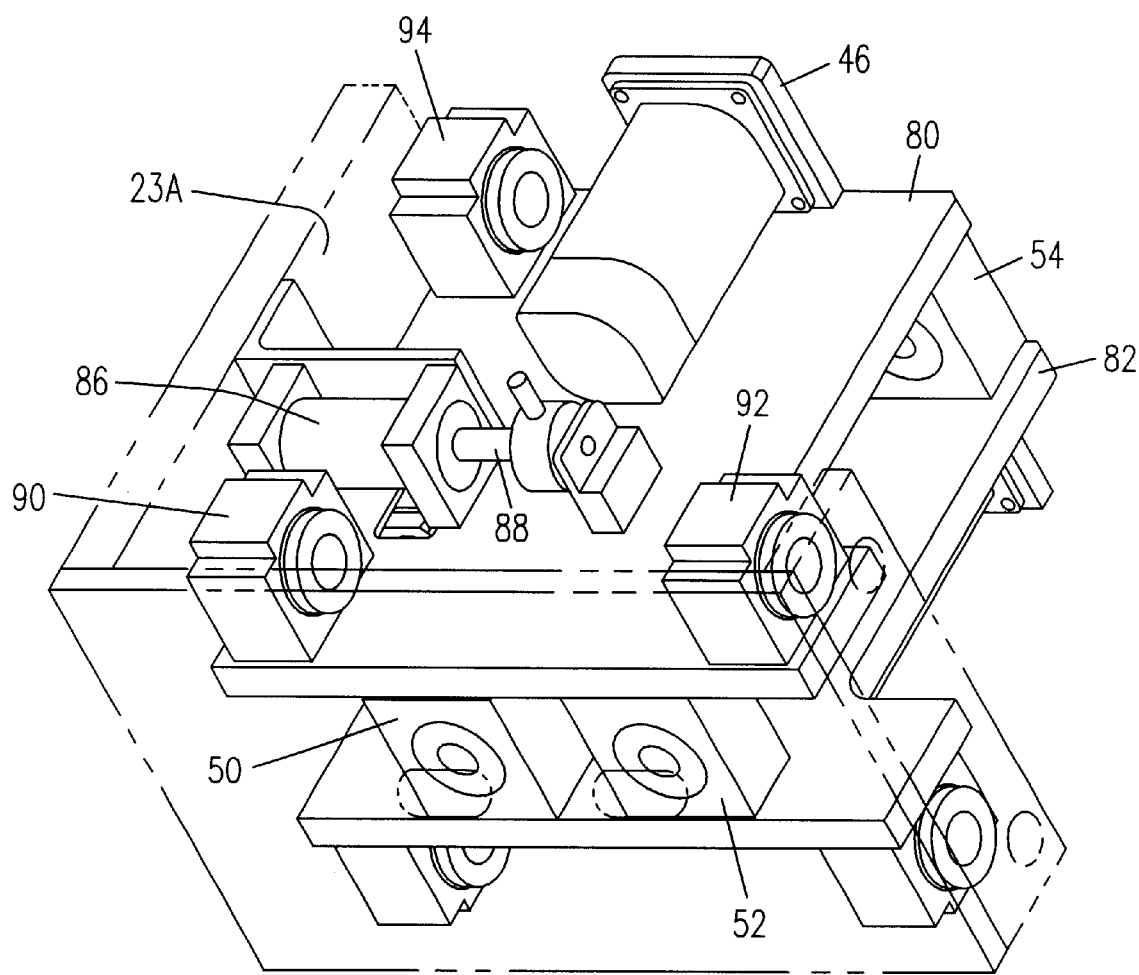
FIG. 4 is a partial perspective view of the wafer cleaner.

FIG. 4 is a partial perspective view of wafer cleaner 14 in accordance with the present invention. AS shown in FIG. 4, mounted to upper plate 80 are bearings 90, 92 and 94. Running through bearings 90, 92 is a first immobilized shaft and running through bearing 94 is a second immobilized shaft (these shafts are not illustrated in FIG. 4 for purposes of clarity). As piston 88 of air cylinder 86 is extended and retracted and upper plate 80 moved, upper plate go slides along the shafts running through bearings 90, 92, and 94. In this manner, plate 80 is prevented from moving in any direction except perpendicular to the plane of section 23A. Similar bearings and shafts are mounted to plate 82 which also prevent plate 82 from is moving in any direction except perpendicular to the plane of section 23A.

Figure 5:
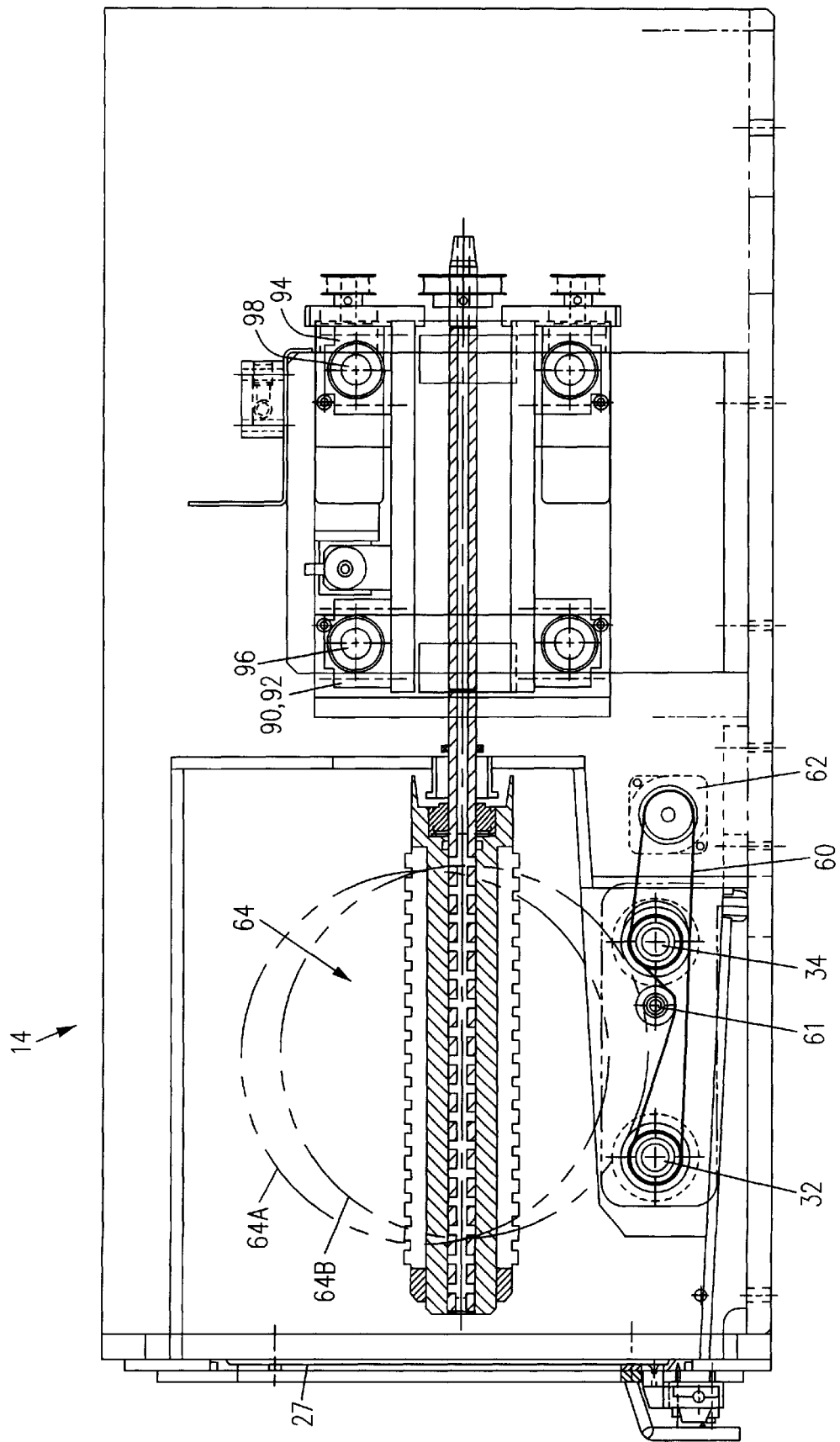
FIG. 5 is a partial side view of the wafer cleaner.

FIG. 5 is a partial side view of water cleaner 14 in accordance with the present invention. As shown in FIG.4, a drive belt 60 couples rollers 32, 34 to roller motor 62. An idler pulley 61 maintains a proper tension in drive belt 60. During use, motor 62 causes drive belt 60 to move thereby rotating rollers 32, 34. Also shown in FIG. 5 are shafts 96 and 98 which run through bearings 90, 92 and 94, respectively.

Figure 6:
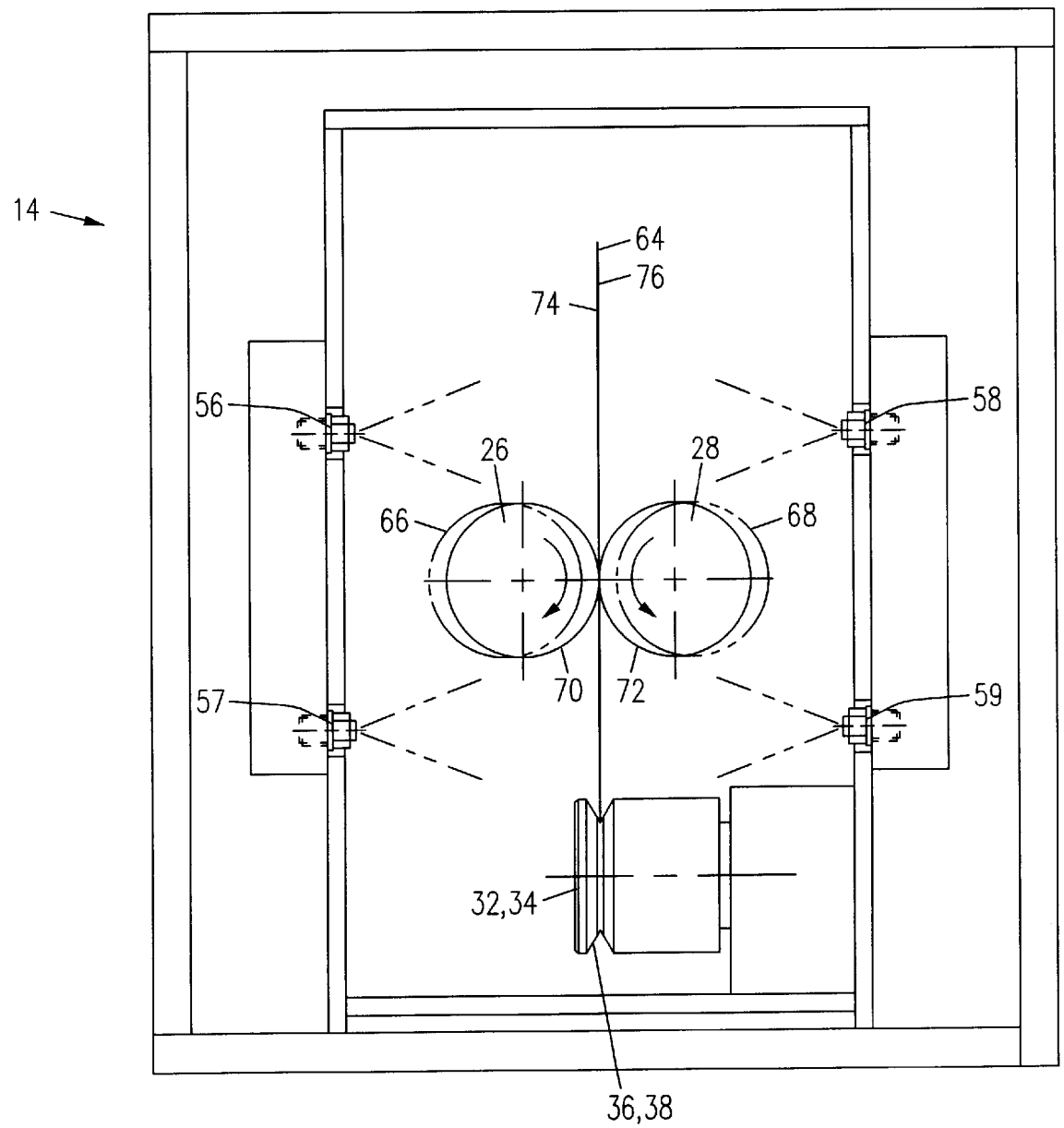
FIG. 6 is a frontal view of wafer cleaner during use in accordance with the present invention.

FIG. 6 is a partial frontal view of wafer cleaner 14 during use in accordance with the present invention. Also shown in FIG. 6, initially brushes 26, 28 are at positions 66, 68, respectively (indicated by dashed circles). Wafer 64 is then inserted vertically through slot 24 into region 30 by robotic arm 10 (not shown). While the wafer is held by end-effector 11 (not shown), brushes 26, 28 are moved towards each other to positions 70, 72, respectively. Typically, brushes 26, 28 travel approximately 0.5 inches between positions 66 and 70, 68 and 72, respectively. At positions 70, 72, brushes 26, 28 contact first and second surfaces 74, 76, respectively, of wafer 64. The perpendicular component of force (force exerted perpendicular to planes fored by surfaces 74, 76 of wafer 64) exerted by brush 26 (and brush 28) on to wafer 64 is measured and controlled. For example, by measured and controlling the force exerted by piston 88 on pressure transducer 89 (FIG. 3), the perpendicular component of force exerted by brushes 26, 28 on to wafer 64 is measured and controlled. Generally, the perpendicular component of force exerted by each brush on wafer 64 is less than 50 pounds per square inch (PSI) and preferably is 5 PSI.

End-effector 11 then releases wafer 64, robotic arm 10 removes end-effector 11 from wafer cleaner 14 and the door 27 over slot 24 is closed. As best seen in FIG. 5, wafer 64 is held by brushes 26, 28 at a first position 64A. Brushes 26, 28 are then caused to rotate by servo motors 44, 46 (FIGS. 2, 3), respectively. Servo motors 44, 46 rotate brushes 26, 28 at substantially the same speed. As shown in FIG. 6, brush 26 is rotated clockwise and brush 28 is rotated counterclockwise. This rotation of brushes 26, 28, forces wafer 64 (to a position 64B in FIG. 5) into V-grooves 36, 38 of rollers 32, 34, respectively. This engages wafer 64 to rollers 32, 34. Motor 62 then causes rollers 32, 34 co rotate which, in turn, cause wafer 64 to rotate. Generally, the wafer is rotated at less than 500 RPMs.

Referring back to FIG. 6, brushes 26, 28 are then flushed from the inside out by liquid supplied to brushes 26, 28 from shafts 40, 42. Substantially simultaneously, first and second sets of spray nozzles 56, 58, spray liquid on brush 26, first surface 74 of disk 64 and brush 28, second surface 76 of disk 64, respectively.

In one embodiment, water cleaner 14 further includes third and fourth sets of spray nozzles 57, 59 located below first and second sets of spray nozzles 56, 58, respectively. During a first stage of the wafer cleaning cycle, a first liquid is sprayed from sets of spray nozzles 57, 59 (or 56, 58). During a second stage of the wafer cleaning cycle, a second liquid is sprayed from sets of spray nozzles 56, 58 (or 57, 59). For example, the first liquid can be a surfactant and the second liquid can be de-ionized water. Alternatively, the same liquid can be sprayed from sets of spray nozzles 56, 57, 58, 59 simultaneously. Further, additional liquids can be sprayed during various stages of the wafer cleaning cycle by adding additional sets of spray nozzles.

Alternatively, only first and second sees of spray nozzles 56, 58 are used, but individual nozzles of each of the sets of spray nozzles are plumbed to different liquids. In that manner, selective nozzles can spray different liquids at various stages in the wafer cleaning cycle.

The flow of liquid to brushes 26, 28 and first and second sets of spray nozzles S6, 58 is controlled by opening and closing valves coupled to feed lines (not shown) which are plumbed to shafts 40, 42 via rotary unions 41, 43, respectively and sets of spray nozzles 56, 58. Further, the operation of water cleaner 14 is controlled by a convention programmable logic controller (PLC), for example by a PLC model #2600 manufactured by Control Technology Corp. located in Hopkinton, Mass.

The combination of the scrubbing action on the surfaces 74, 76 of water 64 caused by the rotation of brushes 26, 20 along with liquid supplied through brushes 26, 28 and by sets of spray nozzles 56, 58, removes particulates from surfaces 74, 76 of wafer 64. In particular, particulates are scrubbed from surfaces 74, 76 by brushes 26, 28, respectively These particulates are flushed from brushes 26, 28 by the liquid supplied to brushes 26, 28 through shafts 40, 42.

Further, particulates which are loosened by the scrubbing action of brushes 26, 28, but remain on surfaces 74, 76 of wafer 64, are flushed from surfaces 74, 76 by liquid sprayed from sets of spray nozzles 56, 58. By orienting wafer 64 vertically instead of horizontally, the removal of particulates from the surfaces 74, 76 is enhanced. In particular, by orienting wafer 64 vertically, liquid sprayed on to surfaces 74, 76 of wafer 64 and particulates trapped in the liquid have a tendency to fall from surfaces 74, 76 due to gravity. In contrast, if wafer 64 were oriented horizontally, particulates would tend to be moved around on surfaces 74, 76 and would nor be an readily removed. Thus, wafer cleaner 14 is particularly well suited for larger diameter wafers in which particulates must be removed from a larger surface area. For example, wafer cleaner 14 is particularly well suited for cleaning 8-inch and 12-inch diameter wafers.

Further, by orienting water 64 vertically and by scrubbing both surfaces 74, 76 simultaneously, mechanical stress on wafer 64 is minimized. This is because the perpendicular component of the force exerted by brush 26 on wafer 64 is offset by the perpendicular component of the force exerted by brush 28 on wafer 64. (The perpendicular components of force exerted by each brush of the wafer is equal and opposite to that of the other brush.) Thus, the net force which is exerted on wafer 64 by brushes 26, 28 is substantially parallel to the plane formed by surface 74 (or surface 76). Since wafer 64 has the greatest mechanical strength in this plane, wafer cleaner 14 is well suited for larger diameter disks. (Larger diameter disks generally flex when force is exerted in a plane perpendicular to side 74.)

After wafer 64 has been scrubbed for a predetermined period of time, generally 30 to 120 seconds and typically 45 seconds, the flow of liquid to brushes 26, 28 and sets of spray nozzles 56, 58, is shut off. Substantially simultaneously, the rotation of rollers 32, 34 and brushes 26, 28 is stopped. Door 27 over slot 24 is opened, robotic arm 10 inserts end-effector 11 into slot 24 and the end-effector 11 engages wafer 64. Then, Brushes 26, 28 are moved back to position 66, 68, respectively, and robotic arm 10 removes wafer 64. Wafer cleaner 14 is now ready to process another wafer.

Referring to FIG. 1, by using two wafer cleaners 14, 16, sequentially, a wafer can be scrubbed and rinsed with two different solutions. In one embodiment, for example, the scrubbing liquid in wafers cleaner 14 is an ammonia solution or a surfactant available from Valtec or Allied. The scrubbing liquid in wafer cleaner 16 is de-ionized water. This arrangement is particularly advantage since surfactant residue on the wafer from wafer cleaner 14 is readily removed by the water rinae in wafer cleaner 16. However in alternative embodiments, other scrubbing liquids are used, for example acid or caustic solutions are used in either wafer cleaner 14 or 16. Further, it is understood that only a single wafer cleaner can be used, or that several wafer cleaners can be used.

Although the present invention has been described with reference to preferred embodiments, persons skilled in the art will recognize that changes may be made in form and detail without departing from the spirit and scope of the invention. For example, the wafer can be a generally circular silicon wafer, glass wafer, ceramic wafer, oxide wafer, tungsten wafer although other types of wafers can be used. Further, although various values have been provided, it is understand that the cycle time, rotational speed of the brushes, rotational speed of the wafer and perpendicular component of force exerted by the brushes of the wafer, depend upon the particular application. Thus, the invention is limited only by the following claims.

We claim:

1. A substrate cleaning apparatus, comprising:

a first brush;

a second brush located horizontally from said first brush;

a first roller and a second roller located vertically below said first brush and said second brush;

a first brush positioner for moving said first brush from a first position to a second position, said first brush contacting a substrate when in said second position;

a second brush positioner for moving said second brush from a first position to a second position, said second brush positioner being disposed vertically below said first brush positioner and being coupled to said first brush positioner, and said second brush contacting said substrate when in said second position; and an air cylinder coupled to one of said first brush positioner and said second brush positioner for moving said first brush from said first position to said second position and said second brush from said first position to said second position.

2. A substrate cleaning apparatus, comprising:

a first brush, said first brush being movable between a first position and a second position, and said first brush contacting a substrate when in said second position;

a second brush located horizontally from said first brush, said second brush being movable between a first position and a second position, and said second brush contacting a substrate when in said second position;

a first roller and a second roller located vertically below said first brush and said second brush; and an air cylinder for moving said first brush from said first position to said second position and said second brush from said first position to said second position, said air cylinder being disposed vertically above said first brush and said second brush.

3. A substrate cleaning apparatus, comprising:

a first brush, said first brush being movable between a first position and a second position, and said first brush contacting a substrate when in said second position;

a second brush located horizontally from said first brush, said second brush being movable between a first position and a second position, and said second brush contacting said substrate when in said second position;

a first roller and a second roller located vertically below said first brush and said second brush;

an air cylinder for moving said first brush from said first position to said second position and said second brush from said first position to said second position; and a pressure transducer for measuring a force exerted by said first brush and said second brush on said substrate.

* * * * *